United States Patent
Georgopapadakos et al.

(10) Patent No.: US 9,742,188 B2
(45) Date of Patent: *Aug. 22, 2017

(54) SYSTEM AND METHOD FOR INSTALLING SOLAR PANELS BASED ON NUMBER OF PANELS AND OUTPUT OF PANELS

(71) Applicant: Energy Development LLC, Honolulu, HI (US)

(72) Inventors: Todd Georgopapadakos, Honolulu, HI (US); Mark Duda, Honolulu, HI (US); Scott Sato, Honolulu, HI (US)

(73) Assignee: ENERGY DEVELOPMENT LLC, Honolulu, HI (US)

( * ) Notice: Subject to any disclaimer, the term of this patent is extended or adjusted under 35 U.S.C. 154(b) by 649 days.

This patent is subject to a terminal disclaimer.

(21) Appl. No.: 13/927,776

(22) Filed: Jun. 26, 2013

(65) Prior Publication Data
US 2015/0001963 A1 Jan. 1, 2015

(51) Int. Cl.
*H02J 1/00* (2006.01)
*H02J 1/10* (2006.01)
(Continued)

(52) U.S. Cl.
CPC ........ *H02J 1/102* (2013.01); *H01L 31/02021* (2013.01); *H02J 13/0006* (2013.01);
(Continued)

(58) Field of Classification Search
CPC .............. H01L 31/02021; H02S 40/34; H02J 3/383–3/385
See application file for complete search history.

(56) References Cited

U.S. PATENT DOCUMENTS 8,892,411 B2 * 11/2014 Tsuruta ............... G06F 17/5009
136/244
8,896,330 B2 * 11/2014 Barnes ..................... H02J 3/383
307/87

(Continued)

FOREIGN PATENT DOCUMENTS

FR 2959324 A1 * 10/2011 .............. H02J 3/383

OTHER PUBLICATIONS

"Installation Guide Sloped Room Mounting System (60-Cell Modules)." Westinghouse Solar version 2.3 (2012): 1-60. <http://www.westinghousesolar.com/images/stories/Resources/2012-Installation_Guide-WHS-WSAC-VC260-V2.pdf>.

*Primary Examiner* — Lincoln Donovan
*Assistant Examiner* — Khareem E Almo
(74) *Attorney, Agent, or Firm* — Polsinelli PC

(57) ABSTRACT

A controller for a plurality of solar panels is provided. An input connector is configured to receive (a) power from the plurality of solar panels, and (b) information from the individual solar panels. An output is configured to forward from the input connector the power from the plurality of solar panels. A controller is configured to receive the information, and based on the information selectively enable or disable the flow of power from the input to the output. The controller enables the flow of power when (a) a number of solar panels connected to the input is within a first threshold, and (b) the total rated output of solar panels connected to the input is within a second threshold. The controller disables the flow of power when (a) a number of solar panels connected to the input exceeds the first threshold, and/or (b) the total rated output of solar panels connected exceeds the second threshold.

21 Claims, 9 Drawing Sheets

(51) Int. Cl.
  *H01L 31/02* (2006.01)
  *H02J 13/00* (2006.01)

(52) U.S. Cl.
  CPC .............. *Y02E 10/50* (2013.01); *Y02E 40/72* (2013.01); *Y04S 10/123* (2013.01); *Y10T 307/766* (2015.04)

(56) References Cited

U.S. PATENT DOCUMENTS

| | | | |
|---|---|---|---|
| 9,172,249 B2* | 10/2015 | Rockenfeller | H02J 3/38 |
| 9,270,201 B1* | 2/2016 | Potharaju | H02M 1/143 |
| 9,379,641 B2* | 6/2016 | Potharaju | H02M 7/5387 |
| 2003/0047209 A1* | 3/2003 | Yanai | H02J 3/32 |
| | | | 136/244 |
| 2004/0211456 A1* | 10/2004 | Brown | F24J 2/5245 |
| | | | 136/243 |
| 2006/0214509 A1* | 9/2006 | Dai | H02J 3/38 |
| | | | 307/11 |
| 2007/0273210 A1* | 11/2007 | Wang | H02J 3/04 |
| | | | 307/45 |
| 2009/0207543 A1* | 8/2009 | Boniface | H02H 3/16 |
| | | | 361/86 |
| 2009/0283129 A1* | 11/2009 | Foss | H02M 7/493 |
| | | | 136/244 |
| 2010/0133911 A1* | 6/2010 | Williams | G05F 1/67 |
| | | | 307/82 |
| 2010/0288327 A1* | 11/2010 | Lisi | H01L 31/02021 |
| | | | 136/244 |
| 2010/0319956 A1* | 12/2010 | Ballard | B60R 16/0207 |
| | | | 174/105 R |
| 2011/0181234 A1* | 7/2011 | Branham | H01L 31/02021 |
| | | | 320/101 |
| 2012/0306279 A1* | 12/2012 | Garabandic | H02J 3/383 |
| | | | 307/85 |
| 2016/0204611 A1* | 7/2016 | Chambon | H02J 3/1835 |
| | | | 307/26 |
| 2016/0211670 A1* | 7/2016 | Nakayama | H02J 3/383 |
| 2016/0241039 A1* | 8/2016 | Cheng | H02J 3/383 |
| 2017/0063147 A1* | 3/2017 | Nakayama | H02J 3/32 |
| 2017/0070074 A1* | 3/2017 | Sugeno | H02J 3/32 |

* cited by examiner

| SYSTEM SIZE | QUANTITY OF AC MODULE RECEPTACLES | SYSTEM CONNECTOR CONFIGURATION |
|---|---|---|
| 3.8KW | 16 | 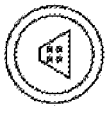 |
| 4.8KW | 20 (10 X 2 CABLES) | 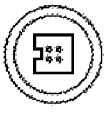 |
| 7.6KW | 32 (16 X 2 CABLES) | 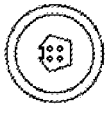 |
| 13.4KW | 56 (14 X 4 CABLES) |  |
| 19.2KW | 85 (17 X 5 CABLES) |  |
Fig. 4

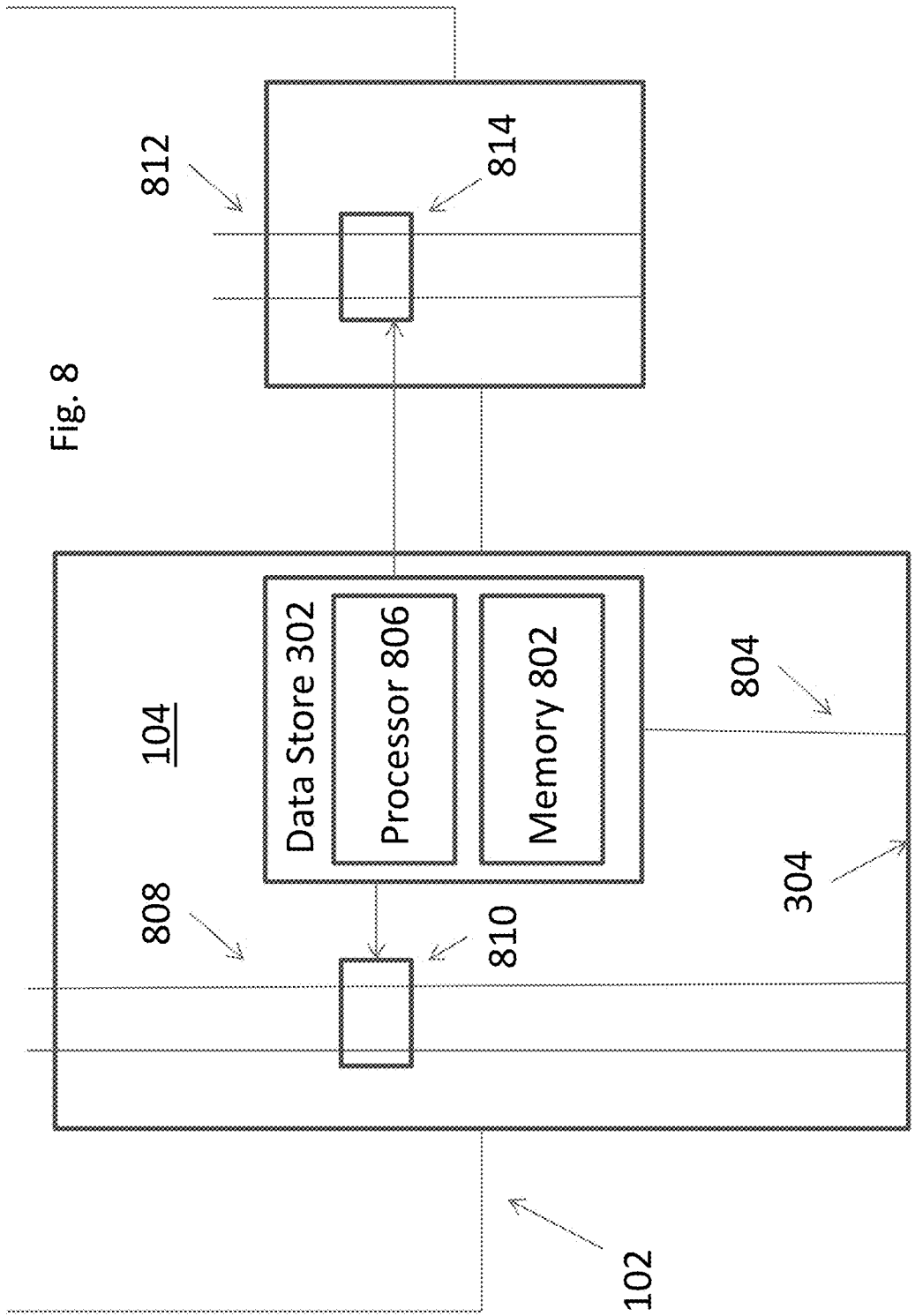

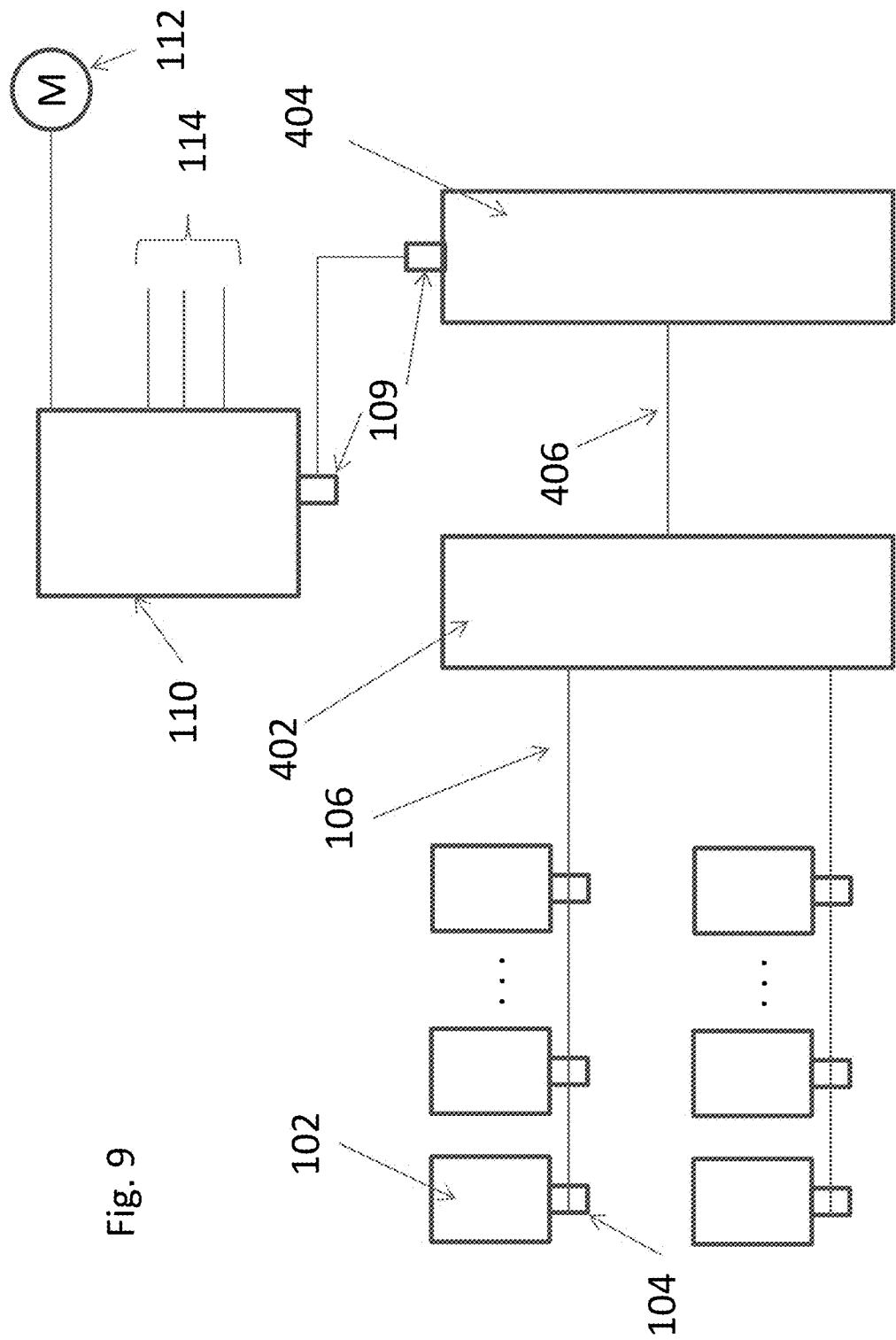

SYSTEM AND METHOD FOR INSTALLING SOLAR PANELS BASED ON NUMBER OF PANELS AND OUTPUT OF PANELS

FIELD OF THE INVENTION

The various embodiments described herein relate generally to the installation of solar panels. More specifically, the instant application relates to a methodology for installing solar panels that minimizes or eliminates the need for specialized training or knowledge in electrical power systems.

BACKGROUND

Solar technology presents a viable green source of energy as an alternative to fossil fuels. This is particularly the case for geographic areas that have a high amounts of daylight and/or higher than average fuel costs, such as Hawaii.

An ongoing obstacle to the adoption of solar panels as a home energy solution remains the expense, particularly in the purchase of the components and the installation. A typical residential solar system, will include a number of solar panels connected by electrical cables to a junction box. The output of the junction box is then fed to load distribution center for internal use. Electrical cable between the solar panels and the junction box are cut to length, and spliced ends of the wires are connected to terminals using generally known methodologies familiar to the field of electricians.

A drawback of the above system is that the total maximum output of the panels must not exceed the capacity of the home's existing electrical service, in that having an output in excess of capacity can damage the system and/or present a safety hazard. However, different solar panels have different outputs and different homes have different capacities. The underlying calculations on the appropriate number of panels are generally known by electricians and professional solar panel installers, but are not typically known by a typical consumer. Many consumers are also not familiar with how to make safe electrical grade connections between components and/or lack the tools to do so. Jurisdictions thus often require professional installers to install solar panel systems to ensure safe and proper installation, which adds to the overall installation costs. In general any wired in place solar or electrical system must be installed by a licensed electrical contractor.

BRIEF DESCRIPTION OF THE DRAWINGS

Various embodiments in accordance with the present disclosure will be described with reference to the drawings, in which:

FIG. 4 illustrates a table of possible shapes of connectors based on system capacity according to an embodiment of the invention.

FIG. 8 illustrates a data store and accompanying components according to an embodiment of the invention.

FIG. 9 illustrates an environment of another embodiment of the invention.

DETAILED DESCRIPTION

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Because of safety concerns, any wired in place solar or electrical system is typically installed by a licensed electrical contractor. Embodiments herein provide methodologies and architecture that address those safety concerns. Embodiment herein can thus this reduce or eliminate the need for onsite engineering and allow anyone to safely connect and install a solar panel system.

Embodiments of the invention herein provide a "plug and play" solar panel installation methodology that requires little or no reliance on professional electricians or installers. End consumers can thus install the systems on their own, thereby reducing the overall installation costs.

Figure 1:
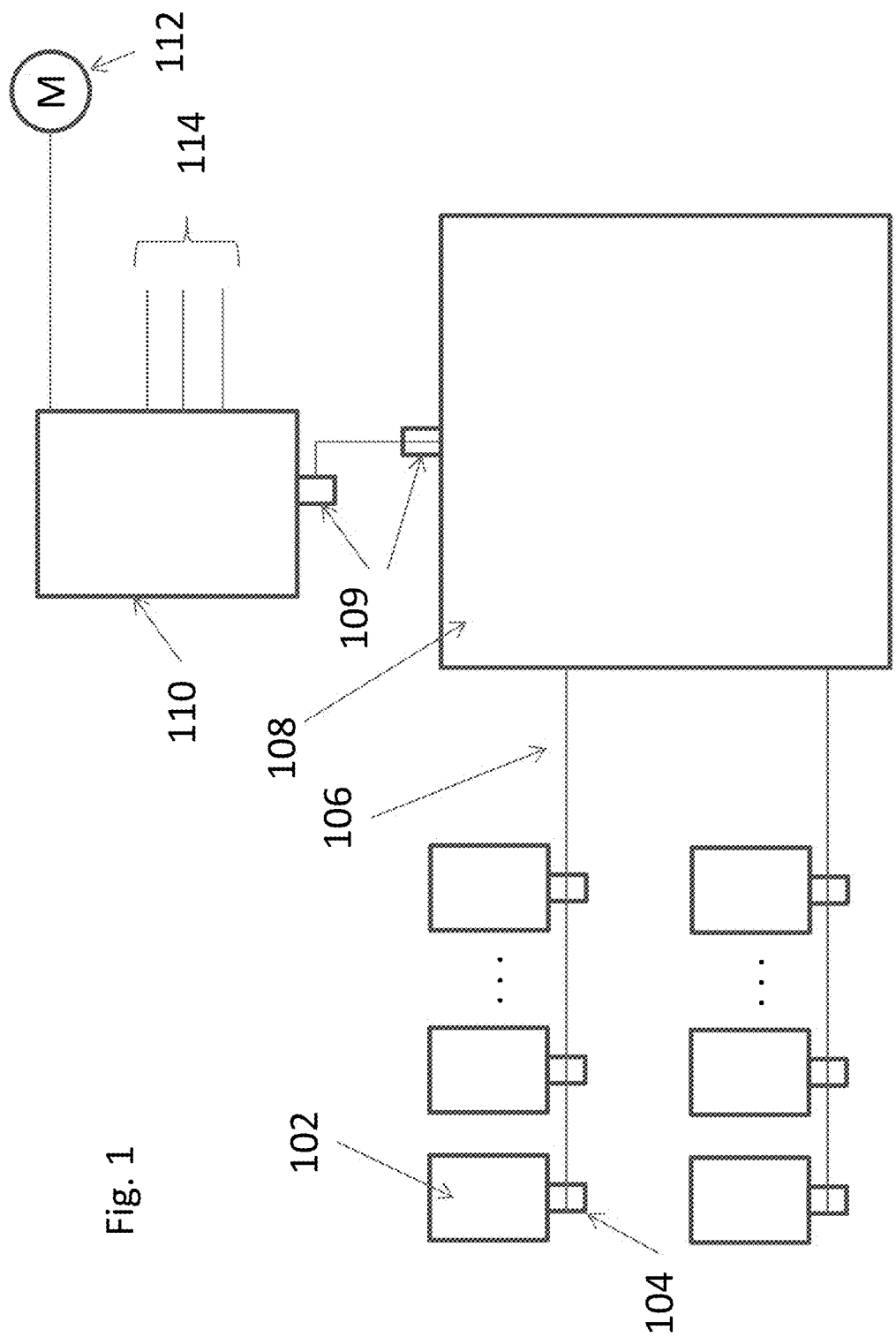
FIG. 1 illustrates an environment of an embodiment of the invention.

Referring now to FIG. 1, an embodiment of a deployed solar panel system is shown. Solar panels 102 are an originating source of electrical power. Each panel 102 includes an interface adaptor 104 that connects to branches of a cable 106. Cable 106 also connects to smart station 108, discussed in more detail below. Smart station 108 in turn connects to a home load center 110 through a connector 109, which in turn connects to a utility meter 112 and/or other electrical leads 114.

Figure 2:
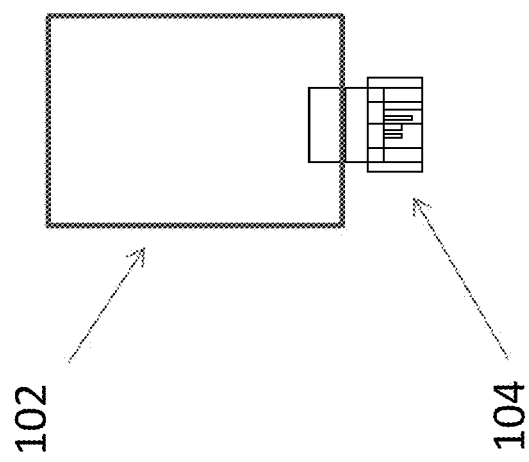
FIG. 2 illustrates a solar panel according to an embodiment of the invention.

Referring now to FIG. 2, an embodiment of solar panel 102 and adaptor 104 is shown (not to scale—panel 102 would typically be considerably larger). Adaptor 104 is preferably the only electrical conduit through which power from panel 102 is sent downstream. Adaptor 104 is also preferably mounted to or otherwise integral with panel 102.

Figure 3:
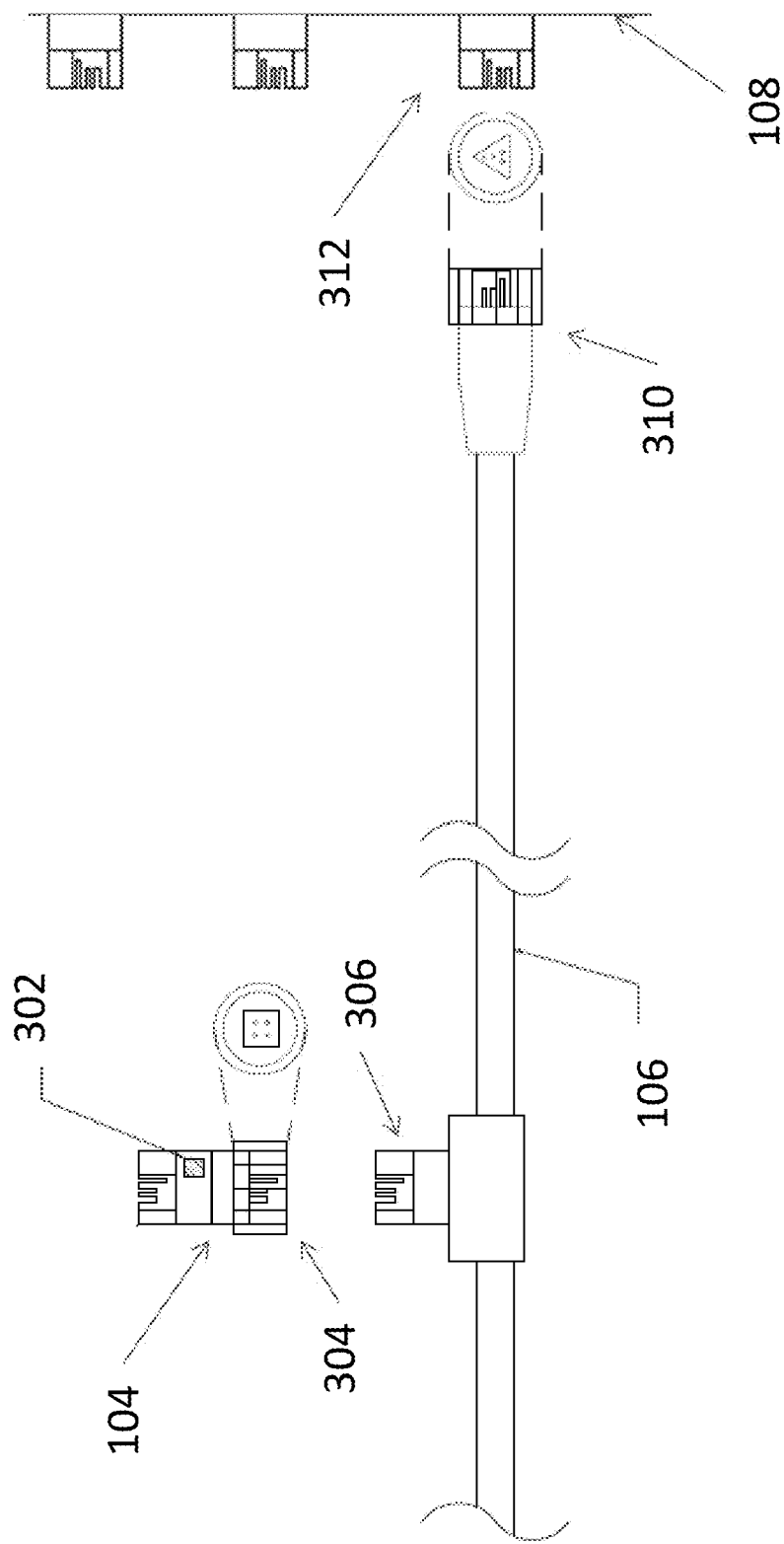
FIG. 3 illustrates a cable connecting to various components according to an embodiment of the invention.

Referring now to FIG. 3, an embodiment of adaptor 104 relative to cable 106 is shown. Adaptor 104 may include a data source 302. Data source 302 preferably is a programmed integrated circuit, but this need not be the case and data source 302 may be any other form of hardware and/or software data source. The invention is not limited to any physical embodiment of data source 302.

Data source 302 preferably includes information about the solar panel 102 to which data source 302 is connected, such information being stored or generated on an as needed basis. Such information may include the rated wattage of the solar panel 102 that data source 302 is associated with. In addition and/or the alternative, such information may include an identifier or marker. Such information may also contain other identification information that may be of use, such as the manufacturer, although such information may not be necessary for operation of the embodiment. The invention is not limited to any particular type of data stored and/or generated by data source 302, or the format of such data. Data source 302 may receive power from the panel 102 directly, through a local battery, or via feedback from smart station 108 or other downstream elements. Data source 302 may also be a passive device that require no independent power, but which can impart its information by modulating other signals that react therewith.

Adaptor 104 also preferably includes a connector 304 with various pins and/or slots configured to mate with a corresponding branch connector 306 of cable 106. The various pathways provided by the pins will be appropriate to convey power from panels 102 to smart station 108, as well as the requisite information from data source 302.

The shape of the connectors 304/306 may have various generic or unique features. At a minimum, each connector combination 304/306 is preferably of a plug in type, i.e., connector 306 can mate with connector 304 by simply physical contact or insertion, and without the need to strip any wires. This provides a "plug and play" feature that allows installation without specific knowledge of safely stripping and connecting electrical cable with electrical terminals.

Connectors 306 may be at preset positions along cable 106. In the alternative, connectors 306 may be snap on components that the consumer can connect to the cable during installation at desired customized positions.

The shape and configuration of connectors 304/306 could be universal to any particular solar panel 102 with adaptor 104. In the alternative the combination could be unique to panels of common rated outputs. By way of non-limiting example, a square arrangement of connectors 304/306 could be used for a panel rated for 50 watts, while a triangular arrangement could be for panels of 100 watts. The number of branch connectors 306 in combination with the unique shape of the connectors can collectively limit the total output of an array of panels 102 to smart station 108. By way of non-limiting example, a cable 106 with sixteen (16) branch points with connectors 306 having a shape specific to 200 watt panels 102 would have a maximum limit of 3.2 kW, and could be used safely with systems that could handle such capacity. Not every connector 306 need be connected to panels, and unused connectors 306 are preferably covered by a weather resistant cap.

Cable 106 also includes a connector 310 at the end that connects to smart station 108, which has a mating connector 312. At a minimum, each connector combination 310/312 is preferably of a plug in type, i.e., connector 310 can mate with connector 312 by simple physical contact or insertion, and without the need to strip any wires. This provides a "plug and play" feature that allows installation without specific knowledge of how to safely strip and connect electrical cable with electrical terminals.

Cable 106 may also include an equipment-grounding conductor as well as optional grounding electrode conductor. The equipment ground conductor would connect to the equipment ground that comes out of the module's power source and ultimately be grounded through the grounding of the home's existing electrical system. The grounding electrode conductor, which grounds the panel/racking system that supports the panels 102, and would connected to a separate ground connection attached to the array and will ultimately be grounded through a separate grounding rod not attached to the home's existing electrical service.

The shape and configuration of connectors 310/312 could be universal to any smart station 108. In the alternative, connector combination 310/312 is preferably unique to the system size as dictated by the smart station 108. By way of non-limiting example, a trapezoid arrangement could be used for a system rated for 3.8 kilowatts, while a hexagon could be for systems of 13.4 kilowatts. FIG. 4 shows a table 400 of non-limiting examples of different connector configurations for different system ratings. The invention is not limited to any particular design or system size. The only guiding principles are that preferably (1) different system sizes have different shaped connectors 310/312, and (2) connectors 310/312 have different shapes than connectors 304/306 that connect panels 102 and cable 106. In addition and/or alternative to different shapes, different colors could also be used.

The number of branched connectors 306 in combination with a unique connection mechanism collectively limit the total output of an array of panels 102 to smart station 108. By way of non-limiting example, a cable 104 with sixteen (16) branch points with connectors 306 specific to 200 watt panels 102 would have a maximum limit of 3.2 kW, and could be used safely with systems that could handle such capacity.

Figure 5:
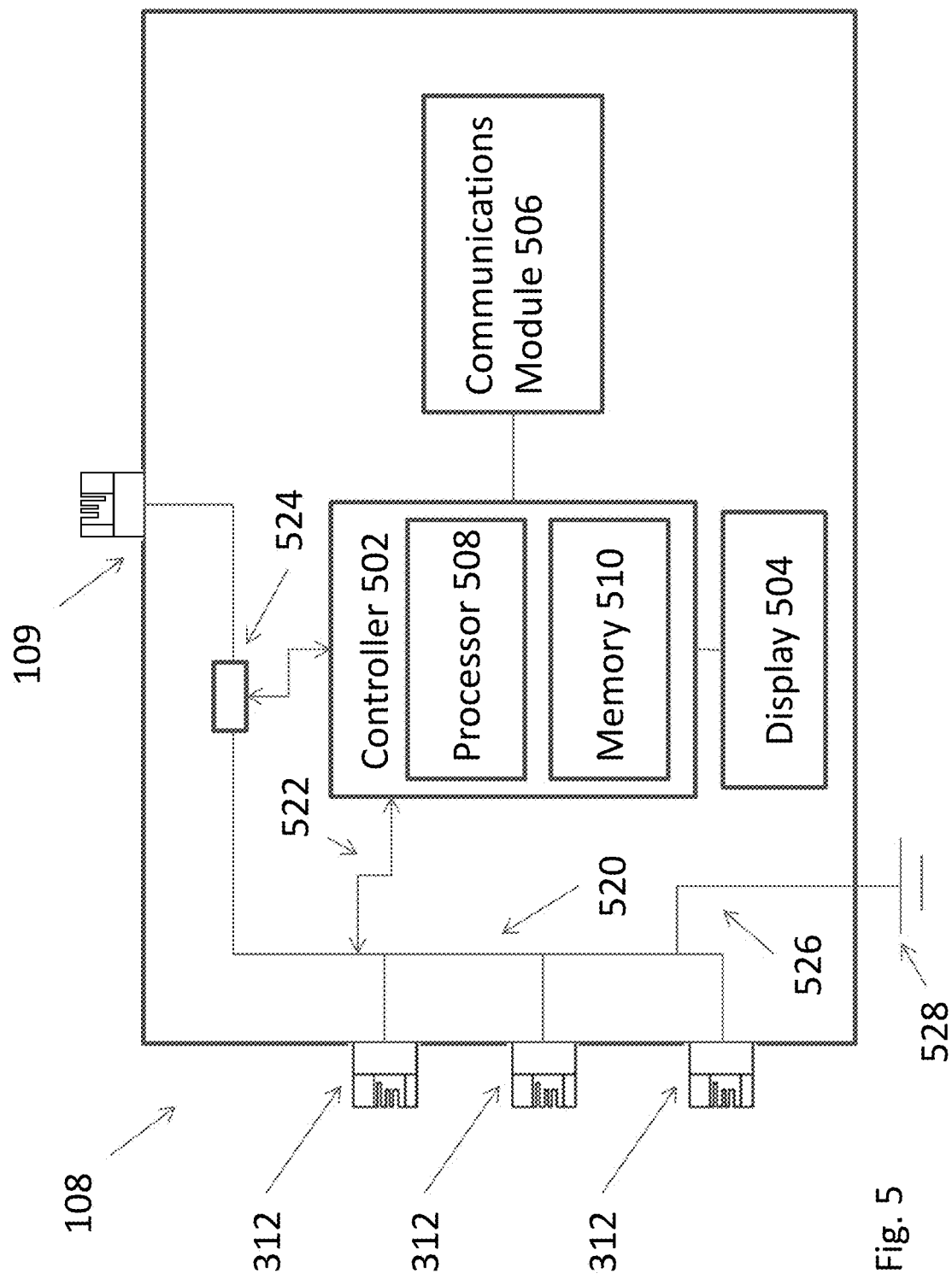
FIG. 5 illustrates an embodiment of a smart station.

As shown in FIG. 5, smart station 108 may have multiple connectors 312 to connect to multiple cables 106. Three are shown in FIG. 5, but there may be any number of connectors 312 (including only a single connector 312) as appropriate for the system. Each of the connectors 312 preferably has the same structure; along with the specific cables 106, this would ensure that each connector 312 connects to the same maximum array of panels 102. However, this need not be the case, and different connectors 312 may be used. The total number of connectors 312 is preferably system specific, e.g., if a smart station 108 can handle 60 panels of a certain type, then three connectors 312 configured to mate with cables 106 that support 20 panels of that type may be appropriate. However, this need not be the case, and there may be more connectors 312.

Alternatively, smart station 108 might have connectors 312 of different types/structures. The smart station would allow the user to select just one, or an appropriate subset, of the multiple connectors 312. Selecting a single connector 312 or an appropriate subset of connectors 312 would preferably disable the other connectors 312. This potentially allows a universal smart station 108 that could be used safely for different system sizes.

Referring now to FIG. 5, a schematic of various control elements of smart station 108 is shown. The smart station 108 has at least one connector 312 to connect to different cables 106 as appropriate. Connectors 312 preferably connect to connector 109 through a power pathway 520; connector 109 ultimately connects to the home load center 110 through a regulation component 524 to deliver power from the array of solar panels 102 for end use. Connector 109 preferably also has a unique shape that is matched to the system, but this need not be the case, and may represent conventional electrical leads. A ground 528 also connects to power pathway 520 via ground pathway 526 for grounding purposes as discussed herein.

Smart station 108 also may include a controller 502, a communications module 506, and a display 504. Controller 502 may include a processor 508 and a memory 510. The various components may be any combination of electronic computer hardware and/or software as needed to effectuate the functionality of smart station 108 as discussed herein. The components, which may be integral or distinct, are connected using known methodologies and are not discussed further herein.

As noted above, cable 106 includes structure to carry information signals from the data sources 302 in the panels 102. These signals reach controller 502 via a signal pathway 522. As discussed in more detail below, controller 502 analyzes the signals and may enable or disable the system based upon system status. Signal pathway 522 is shown as a bidirectional pathway, but it may be unidirectional.

Controller 502 may be programmed with certain maximum/minimum parameters of the system. For example, controller 502 may be programmed with a maximum number of panels 102 and/or maximum amount of wattage that the system can support. Controller 502 may also be in communication with the data sources 302 of the panels 102. Since the data source 302 may include information about the corresponding panel 102, system controller 502 can determine whether the complete system connections are within the maximum parameters, and disable the system when this is not the case. For example, system controller 502 can determine whether too many panels 102 are connected, or whether the total rated wattage of the connected panels 102 exceed what the system can handle. Controller 502 can also monitor the presence of ground fault errors, loss of grounding continuity, over-current and/or over-voltage. These are exemplary only, and the invention is not limited to any particular system parameter(s) that controller 502 monitors and/or reacts to.

Regulator element 524 can be used for system control. Regulator 524 may be a simple switch under control from controller 502. Controller 502 can thus enable or disable the flow of power through smart station 108. Alternatively, controller 502 could instruct panel 102 to shutdown via data source 302. The structure of such components are known to those of skill and not further detailed herein.

Controller 502 also may be programmed to monitor the output current of the array of panels 102. As discussed below, it is possible for the array of panels 102 to generate higher output than system capacity. In such a case, controller 502 could disable the system, or otherwise govern the output fed to home load center 110 back to within acceptable levels. In theory some element would need to monitor this collective power flow for controller 502 to make the appropriate decision; regulator element 524 could by way of non-limiting example include an ammeter that monitors the collective power flow and informs controller 502.

Controller 502 could also attempt to rectify the problem by altering the electrical layout of the system. For example, control 502 could shut down one or more of connectors 312. In another example, control 502 could instruct one or more adaptors 104 to disconnect or reduce the power flow from their corresponding panels 102; selective deactivation of adaptors 104 may identify a "problem" panel 102. In addition and/or the alternative, adaptors 104 could monitor the flow of electricity of the panel and on its own authority shut down the power connection if the output of the panel exceeds the rated wattage. Such intelligent capability may also be incorporated in the same integrated circuitry of adaptor 104 that supports data source 302.

Figure 6:
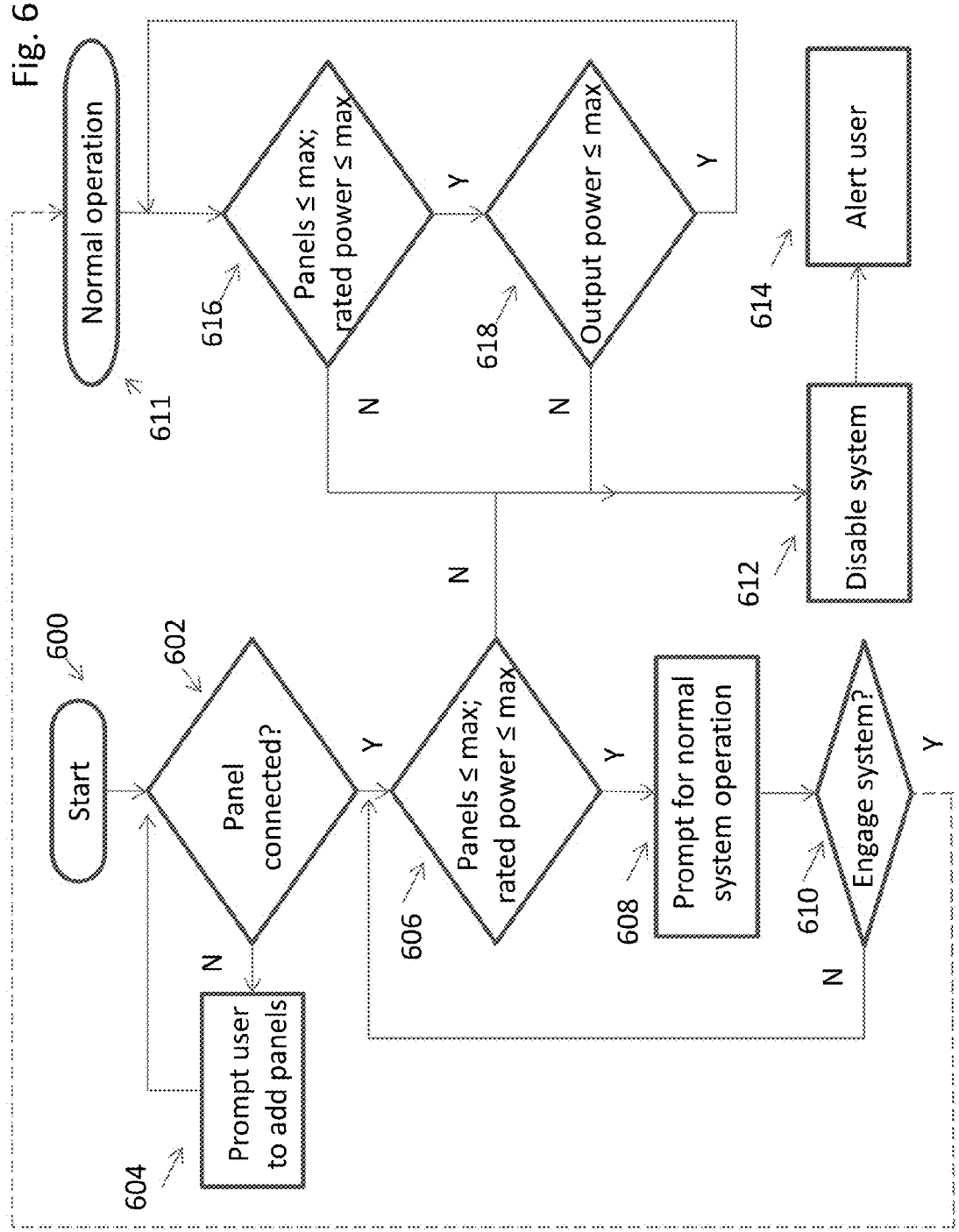
FIG. 6 illustrates a flowchart of the operation of a smart station according to an embodiment of the invention.

Referring now to FIG. 6, a flowchart of an example of a methodology for controller 502 is shown. At step 600, the system starts and initializes. As part of this initialization, the continuity of the equipment grounding conductor between smart station 108 and panels 102 may be tested. At step 602, controller 502 detects whether or not at least one panel is connected to the system; such detection may be via information of the data sources 302 of an attached panel 102, or the simple detection of a power output from a panel 102. If no panel is connected, the user is prompted at step 604 to attach additional panels, and control returns to step 602; this cycle loops until a panel is detected, at which point control passes to step 606. The prompt at 604 may be via display 504, or a signal sent through communications module 506 to a remote device. In another embodiment, steps 602 could be configured to determine if a pre-set number of panels 102 have been reached, and prompts the user to add panels until that number is achieved.

At step 606, controller 502 confirms that the connected panels 102 are within the operating system parameter(s). The controller 502 preferably determines this based on the information from the connected data sources 302 relative to a stored threshold, which may be a data table. For example, if the parameter is number of panels, then controller 502 counts the number of data sources 302 that it receives signals from (this may a direct count, or an indirect count based on data taken from the information received from the data sources 302). If the parameter is the total rated wattage, then controller 502 adds the rated wattages of the panels as received from data sources 302. These accumulated value(s) are then compared against the threshold as stored. If the value(s) are within acceptable limits, then the user is prompted at step 608 that the system can be enabled. If one or more of the values are not within acceptable limits (e.g., there are too many panels, and/or the total rated wattage is above system capacity), then the system is disabled at step 612 and the user is prompted of the nature of the problem at step 614. Additional checks may also be occurring for system abnormalities, e.g., grounding fault, over-voltage, over-current, etc.

Steps 606 and 608 continue in a loop until the user activates the system at 610; this gives the user the opportunity to add more panels while the system monitors changes to confirm that the installation remains within system parameters. Once the user engages the system at 610 (which in FIG. 6 only occurs if the system is not exceeding some value at 606), normal system operation engages at step 611.

During normal system operation, controller 502 continues to monitor the status of the data sources 302 for changes in the connected panels 102, and potentially other system abnormalities. If a configuration change occurs that exceeds system parameter(s) at step 616, then controller 502 disables or governors the system at step 612 as discussed above.

Optionally, the system can as a fallback at step 618 determine whether the total output of the array of panels 102 exceeds a safety level; this safety level could be the same threshold as used for the total rated wattage, or some other value. If such an excess is detected, controller 502 disables or governors the system at 612. In the alternative, control 502 can communicate with the adaptors 104 to shut down individual panels.

Figure 7:
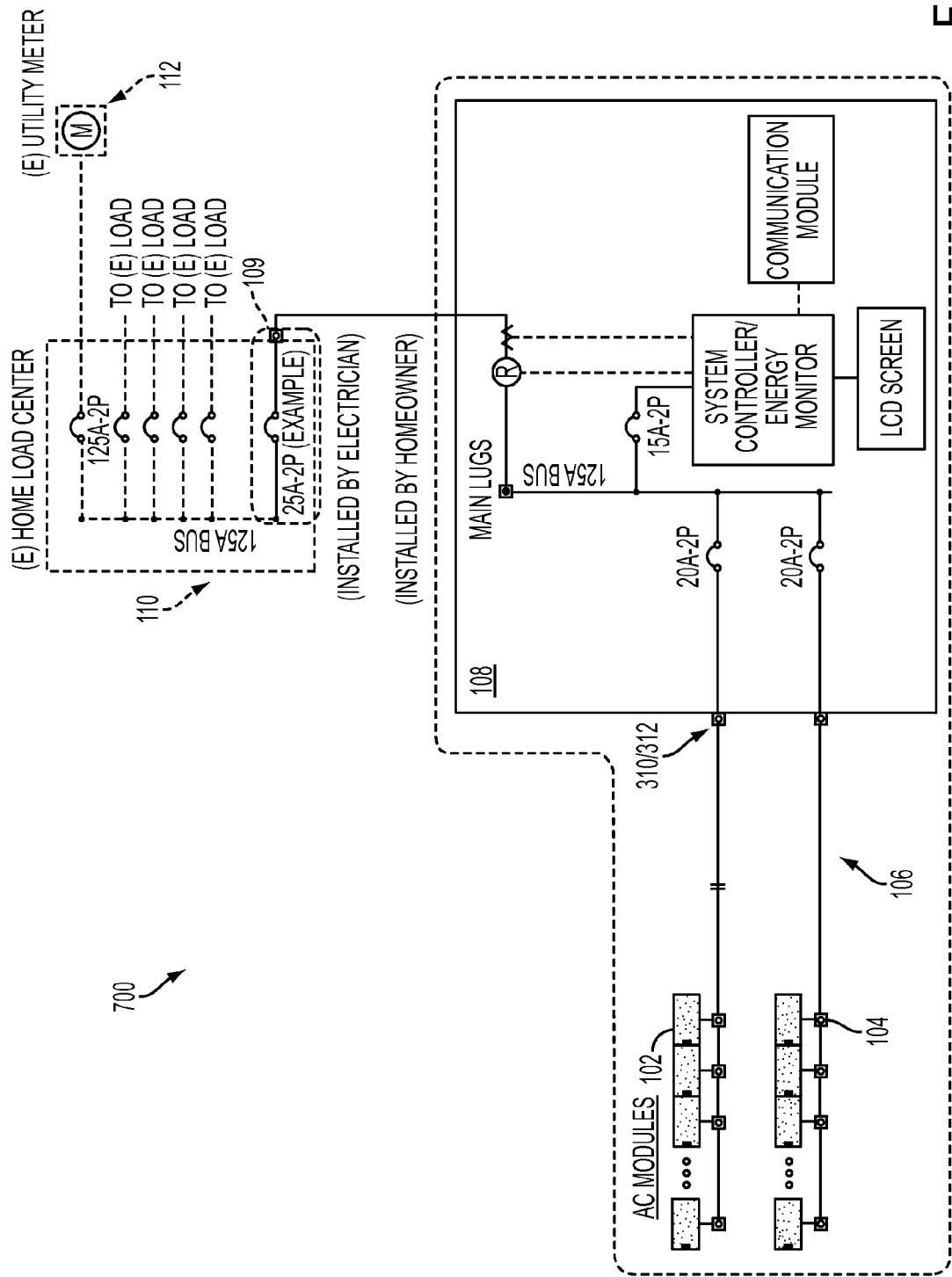
FIG. 7 illustrates a more detailed end-to-end embodiment of the invention

Referring now to FIG. 7, a more detailed schematic of a system 700 according to an embodiment of the invention is shown.

As noted above, it is possible that overages can occur despite the above safety measures. One such reason is simple mechanical failure. Another such reason would be if the user defies the instructions and connects multiple panels 102 in series or parallel through connections other than adaptor 104, referred to herein as a "cluster" of panels. Yet another would be if a user damaged the system by cutting and splicing wires together. In such a case the information from data store 302, which is specific to a particular panel, would not accurately represent the number of panels or the output characteristics of the cluster.

There are a variety of methodologies to prevent the formation of clusters. One such methodology is to exclude connectors on panels 102 other than adaptor 104 bearing specific connectors 304. Another methodology for when other connections are present is to physically or electrically disable such other connections when adaptor 104 is used. For example, insertion of connector 306 into 304 physically flips a switch that disconnects other connectors. By way of another example, adaptor 104 includes a cap that may be inserted into other connectors inherent to panel 102.

Referring now to FIG. 8, a schematic of an embodiment of data store 302 on adaptor 104 relative to panel 102 is shown. At a minimum, data store preferably includes a memory 802 with the information about panel 102. Memory 802 can communicate with cable 106 via a signal pathway 804 that terminates in connector 304.

If "smart" functions are desired, a processor 806 may also be provided. One optional smart function is for processor 806 to control power output from panel 102 via switch 810 on power lines 808. Another optional smart function is for processor 806 to control other power connections 812 via a switch 814. As noted above, data store 302 can, either on its own control or under instruction from smart station 108, enable and disable the various power conduits to prevent daisy chaining and/or to isolate potential problem areas.

According to another embodiment of the invention, the functionality of smart station 108 can be separated into distinct components, which may have distinct or overlapping functionality. By way of non-limiting example, FIG. 9 shows smart combiner 402 that connects to a station 404. Smart combiner 402 may be mounted on the roof or otherwise in close proximity of the panels 102; the racking (not shown) for the array of solar panels 102 may be an appropriate attachment structure. The closer proximity allows for shorter cables 106, as cables 106 do not need to run the full length to the station 404. A single cable/connection 406 can then connect smart combiner 402 and smart station 404.

The cable 106's will feed into the smart combiner 402 via connectors 312 consistent with the description of FIG. 1. Smart combiner 402 may have components similar to those discussed with respect to FIG. 5 to monitor and react to system parameters. This will give the user real-time feedback (such as LED lights) regarding connections about how many panels 102 can be safely connected as the user is connecting panels on the roof. The smart combiner box may also ground the panels and racking system by biting into the racking. In this embodiment, other functions of the smart station 108 of FIG. 1—including shutting off the power or reducing power produced by the solar panels, cutting off the flow of power into the home's electrical system, recognizing ground faults, over-voltage, and over-current situations, etc.—would be part of station 404. Smart combiner 402 and station 404 could be connected by custom end cables in the manner discussed herein, or more conventional electrical wiring. Smart combiner 402 could serve a grounding function by clipping directly on to the racking for the panels. The smart combiner 402 could ground the racking by running a grounding wire back through the cable from the smart connector to the smart station 108.

The various system monitoring and diagnostics of the embodiment of FIG. 9 preferably run according to the same flowchart as shown in FIG. 6. However, the functionality of controller 502 in the decision making can be implemented in smart combiner 402 and/or station 404. If both combiner 402 and station 404 have controllers, the two may consult with each other (which may be as simple as exchanging data) to determine whether the system is operating within safe parameters and/or whether act needs to be taken.

The distribution of components and functionality in connection with FIG. 9

Solar panels 102 preferably include a DC/AC inverter to output AC power, such that cables 106 would be at least partially AC power cables. A charge converter and/or batteries (not shown) could also be provided.

The various connectors herein are described as single/unitary connectors. However, this need not be the case, and the connectors could have multiple branches, e.g., one or more branches for power transmission, one or more branches for grounding purposes, and/or one or more branches for information transmission. Each branch may itself be made of one or more wires.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A control device for a plurality of solar panels, comprising:
   an input connector, configured to receive (a) power from the solar panels, and (b) non-power information from the solar panels representing a rated output of each of the solar panels;
   an output, configured to forward from the input connector the power from the solar panels;
   a controller to determine from the non-power information received at the input connector (a) a total number of the solar panels connected to the input connector, and (b) a total rated output of the solar panels connected to the input connector, and configured to selectively enable or disable a flow of power from the input connector to the output as follows;
   wherein the controller enables the flow of power in response to (a) the total number of the solar panels connected to the input connector being determined by the controller to be within a first threshold, and (b) the total rated output of the solar panels connected to the input connector being determined by the controller to be within a second threshold;
   wherein the controller disables the flow of power in response to the total number of the solar panels connected to the input connector being determined by the controller to exceed the first threshold; and
   the controller disables the flow of power in response to the total rated output of the solar panels connected to the input connector being determined by the controller to exceed the second threshold;
   wherein the controller adds the rated output of the panels based on the non-power information to reach the total rated output.

2. The control device of claim 1, wherein the controller overrules enablement of the flow of power and disables the flow of power when a total actual output of the solar panels connected to the input exceeds a third threshold.

3. The control device of claim 2, wherein the second and the third threshold are the same.

4. The control device of claim 1, wherein the controller governors the flow of power to the output when a total actual output of the solar panels connected to the input exceeds a third threshold.

5. The control device of claim 1, wherein the input connector is physically uniquely configured based on a first parameter, and will only mate with a cable that is configured consistent with that first parameter.

6. The control device of claim 5, wherein the first parameter is based on the rated wattage of the system that the controller supports.

7. The control device of claim 1, further comprising a cable connected to the input connector, the cable having connector at an end that mates with the input connector, and multiple branch connectors to connect the cable to the solar panels.

8. The control device of claim 7, wherein the cable has a power pathway and a data pathway distinct from the power pathway to carry both the power and the information from the solar panels, respectively.

9. The control device of claim 7, wherein each of the branch points has a connector that is unique to a second parameter relating to the solar panel.

10. The control device of claim 9, wherein the second parameter is the rated wattage of the corresponding solar panel.

11. The control device of claim 9, wherein the multiple branch connectors cannot mate with solar panels that have a different second parameter.

12. The control device of claim 1, further comprising:
a plurality of solar panels; and
each of the solar panels being configured to transmit information about the solar panel to the controller.

13. The control device of claim 1, wherein the information includes the rated wattage of the solar panel.

14. A solar panel system, comprising:
a plurality of solar panels, each panel configured to generate power and transmit non-power information representing a rated wattage of the panel;
an input connector, configured to receive the power and the information from each of the solar panels;
an output, configured to forward from the input connector the power from the plurality of solar panels;
a controller determining from the information received at the input connector (a) a total number of the solar panels connected to the input connector, and (b) a total rated output of the solar panels connected to the input connector, and configured to selectively enable or disable a flow of power from the input connector to the output as follows;
wherein the controller enables the flow of power in response to (a) the total number of the solar panels connected to the input connector being determined by the controller to be within a first threshold, and (b) the total rated output the solar panels connected to the input connector being determined by the controller to be within a second threshold; and
wherein the controller disables the flow of power in response to the total number of the solar panels connected to the input connector being determined by the controller to exceed the first threshold; and
the controller disables the flow of power in response to the total rated output of the solar panels connected to the input connector being determined by the controller to exceed the second threshold;

a cable connecting the controller to the solar panels for passing the power and the information along a power pathway and a data pathway, respectively.

15. The system of claim 14, wherein the cable has a connector customized to the input connector of the controller and unique to a predetermined parameter relating to how much power the system can handle.

16. The system of claim 14, wherein the cable has branch points for connecting to the solar panels, each of the branch points and the solar panels have connectors unique to a predetermined parameter relating to the rated wattage of the solar panel.

17. The control device of claim 14, wherein the cable has a power pathway and a data pathway distinct from the power pathway to carry both the power and the information from the solar panels, respectively.

18. A control device for a plurality of solar panels, comprising:
an input connector, configured to receive (a) power from the solar panels, and (b) non-power information from the solar panels representing the rated output of each of the solar panels;
an output, configured to forward from the input connector the power from the solar panels;
a controller to determine from the information received at the input connector a total rated output of the solar panels connected to the input connector, and configured to selectively enable or disable a flow of power from the input connector to the output as follows;
wherein the controller enables the flow of power in response to at least the total rated output of the solar panels connected to the input connector being determined by the controller to be within a second threshold;
wherein the controller disables the flow of power in response to the total rated output of the solar panels connected to the input connector being determined by the controller to exceed the second threshold.

19. The control device of claim 18, wherein the controller overrules enablement of the flow of power and disables the flow of power when a total actual output of the solar panels connected to the input exceeds a third threshold.

20. The control device of claim 18, wherein the input connector is physically uniquely configured based on a first parameter, and will only mate with a cable that is configured consistent with that first parameter.

21. The control device of claim 18, further comprising a cable connected to the input connector, the cable having connector at an end that mates with the input connector, and multiple branch connectors to connect the cable to the solar panels, wherein the cable has a power pathway and a data pathway distinct from the power pathway to carry both the power and the information from the solar panels, respectively.

* * * * *